United States Patent
Harrington, III et al.

(10) Patent No.: US 9,496,386 B2
(45) Date of Patent: Nov. 15, 2016

(54) DEVICE ARCHITECTURE AND METHOD FOR IMPROVED PACKING OF VERTICAL FIELD EFFECT DEVICES

(71) Applicant: D3 Semiconductor LLC, Addison, TX (US)

(72) Inventors: Thomas E. Harrington, III, Carrollton, TX (US); Robert Kuo-Chang Yang, Campbell, CA (US)

(73) Assignee: D3 Semiconductor LLC, Addison, TX (US)

( * ) Notice: Subject to any disclaimer, the term of this patent is extended or adjusted under 35 U.S.C. 154(b) by 0 days.

(21) Appl. No.: 14/817,010

(22) Filed: Aug. 3, 2015

(65) Prior Publication Data
US 2015/0340454 A1    Nov. 26, 2015

Related U.S. Application Data

(62) Division of application No. 14/091,169, filed on Nov. 26, 2013, now Pat. No. 9,117,899.

(60) Provisional application No. 61/729,686, filed on Nov. 26, 2012.

(51) Int. Cl.
*H01L 29/78*    (2006.01)
*H01L 29/04*    (2006.01)
(Continued)

(52) U.S. Cl.
CPC ..... *H01L 29/7813* (2013.01); *H01L 21/26586* (2013.01); *H01L 29/045* (2013.01);
(Continued)

(58) Field of Classification Search
CPC .................. H01L 29/7813; H01L 29/66734;
H01L 29/41766; H01L 29/42364; H01L 29/42372; H01L 29/66727; H01L 29/0634; H01L 29/1095; H01L 29/4238
USPC .................................. 438/197, 270; 257/330
See application file for complete search history.

(56) References Cited

U.S. PATENT DOCUMENTS

2004/0036121 A1    2/2004 Aoki et al.
2005/0035401 A1    2/2005 Yamaguchi et al.
(Continued)

FOREIGN PATENT DOCUMENTS

| | | |
|---|---|---|
| JP | 2005317828 | 11/2005 |
| WO | 2011013379 | 2/2011 |
| WO | 2012149195 | 11/2012 |

OTHER PUBLICATIONS

E.A. Lewis, "The Effect of Surface Orientation on Silicon Oxidation Kinetics," J. Electrochem. Soc.: Solid State Science and Technology, Sep. 1, 1987, pp. 2322-2329.

*Primary Examiner* — Dung Le
(74) *Attorney, Agent, or Firm* — Schultz & Associates, P.C.

(57) ABSTRACT

A semiconductor field-effect device is disclosed that utilizes an octagonal or inverse-octagonal deep trench super-junction in combination with an octagonal or inverse-octagonal gate trench. The field-effect device achieves improved packing density, improved current density, and improved on resistance, while at the same time maintaining compatibility with the multiple-of-45°-angles of native photomask processing and having well characterized (010), (100) and (110) (and their equivalent) silicon sidewall surfaces for selective epitaxial refill and gate oxidation, resulting in improved scalability. By varying the relative length of each sidewall surface, devices with differing threshold voltages can be achieved without additional processing steps. Mixing trenches with varying sidewall lengths also allows for stress balancing during selective epitaxial refill.

21 Claims, 7 Drawing Sheets

(51) Int. Cl.
*H01L 29/66* (2006.01)
*H01L 29/423* (2006.01)
*H01L 21/265* (2006.01)
*H01L 29/739* (2006.01)
*H01L 29/06* (2006.01)
*H01L 29/10* (2006.01)

(52) U.S. Cl.
CPC ....... *H01L29/0634* (2013.01); *H01L 29/0653* (2013.01); *H01L 29/0696* (2013.01); *H01L 29/4236* (2013.01); *H01L 29/4238* (2013.01); *H01L 29/66348* (2013.01); *H01L 29/66666* (2013.01); *H01L 29/66734* (2013.01); *H01L 29/7397* (2013.01); *H01L 29/7827* (2013.01); *H01L 29/1095* (2013.01)

(56) References Cited

U.S. PATENT DOCUMENTS

| | | |
|---|---|---|
| 2006/0102953 A1 | 5/2006 | Miura et al. |
| 2007/0029597 A1 | 2/2007 | Lee |
| 2007/0108512 A1 | 5/2007 | Sedlmaier et al. |
| 2008/0258239 A1 | 10/2008 | Ishiguro et al. |
| 2010/0193800 A1 | 8/2010 | Uchida et al. |
| 2011/0180812 A1 | 7/2011 | Masuda et al. |
| 2013/0075814 A1* | 3/2013 | Meiser ............. H01L 23/481 257/334 |
| 2013/0299900 A1* | 11/2013 | Anderson .......... H01L 29/7813 257/330 |

\* cited by examiner

DEVICE ARCHITECTURE AND METHOD FOR IMPROVED PACKING OF VERTICAL FIELD EFFECT DEVICES

CROSS-REFERENCE TO RELATED APPLICATIONS

This application is divisional application of U.S. application Ser. No. 14/091,169, filed Nov. 26, 2013, which claims priority benefit from U.S. Provisional Application No. 61/729,686 filed Nov. 26, 2012. Each patent application identified above is incorporated herein by reference in its entirety to provide continuity of disclosure.

FIELD OF THE INVENTION

The present invention relates generally to the methods and techniques for improving the packing density of vertical semiconductor devices utilizing three-dimensional octagonal and inverse-octagonal structures.

BACKGROUND OF THE INVENTION

For many years, manufacturers and developers of high performance power electronics have sought to improve power-handling density of discrete electronic components.

For power electronics, however, there is a need to achieve improved power density by techniques other than reducing device dimensions. There is a need for innovative device architectures that allow for greater current-per-unit-area, higher voltages, lower on-resistance, and shorter switching time. Such device architectures would provide greater power density resulting in smaller power electronic switching systems, they also would provide for faster and more efficient switching, resulting in reduced energy consumption and reduced heat generation.

SUMMARY OF THE DISCLOSURE

The present invention is a semiconductor device architecture that improves the power density achievable with a vertical power MOSFET device, and provides a method for further scaling of power density.

According to a preferred embodiment, a vertical power field effect device, such as a MOSFET or an IGBT, utilizes an octagonal or inverse-octagonal deep trench super-junction in combination with an octagonal or inverse-octagonal gate trench. The octagonal and/or inverse-octagonal geometries form the patterns for creating charge compensation zones and gate zones. The octagonal and/or inverse-octagonal geometries are drawn with vertices at multiples of 45 degrees (45°, 90°, 135°, 180°, 225°, & 270°) and an internal angle of 135°, so that these geometries can fracture into rectangles and trapezoids without errors when creating masks, and so that these geometries expose {010}, {001} and {110} lattice planes and their equivalent silicon sidewall surfaces with known oxidation and epitaxial deposition characteristics. Selective epitaxial refill and gate oxidation during device processing result in an improved scalability. The device also achieves a field-effect device with improved packing density, improved current density, and improved on-resistance, while at the same time maintaining compatibility with the multiple-of-45°-angles of native photomask processing. In addition, by varying the length of each sidewall surface, devices with differing threshold voltages can be achieved without additional processing steps. In further addition, combining trenches with varying sidewall lengths allows for stress balancing during selective epitaxial refill.

In a first embodiment, the charge compensation zones (n-columns and p-columns which charge compensate each other) are formed by etching deep trenches using the octagonal or inverse-octagonal surface pattern into a semiconductor material having a first doping type (which may be an epitaxial semiconductor material for a MOSFET and some types of IGBT, and a non-epitaxial semiconductor material for other types of IGBTs), and then refilling the trenches with doped selective epitaxial material (SEG or selective epitaxial growth) of a second doping type to form the charge compensation regions.

Alternatively, in another embodiment, the sidewalls of the trenches may be implanted to dope them with a first doping type, and then refilled with doped selective epitaxial material of the second doping type to form the charge compensation regions.

Alternatively, in another embodiment, the sidewalls of the trenches may be implanted to dope them with a second doping type to form the charge compensation regions, after which the trenches may be refilled with an insulating material.

After the formation of the octagonal or inverse-octagonal charge compensation regions, gate trenches are etched into the silicon in an octagonal or inverse-octagonal pattern. An insulating layer is grown or deposited into the gate trenches, after which a gate electrode material such as polysilicon is deposited into the gate trenches to complete their formation.

BRIEF DESCRIPTION OF THE DRAWINGS

FIG. 1 also identifies some of the silicon sidewall planes which participate in the trench sidewalls.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not limit the scope of the invention.

In describing crystallographic lattice planes, the notation {hkl} is used which represents a family of equivalent lattice planes to the (hkl) lattice plane specified by the Miller indices h, k and l.

Figure 1:
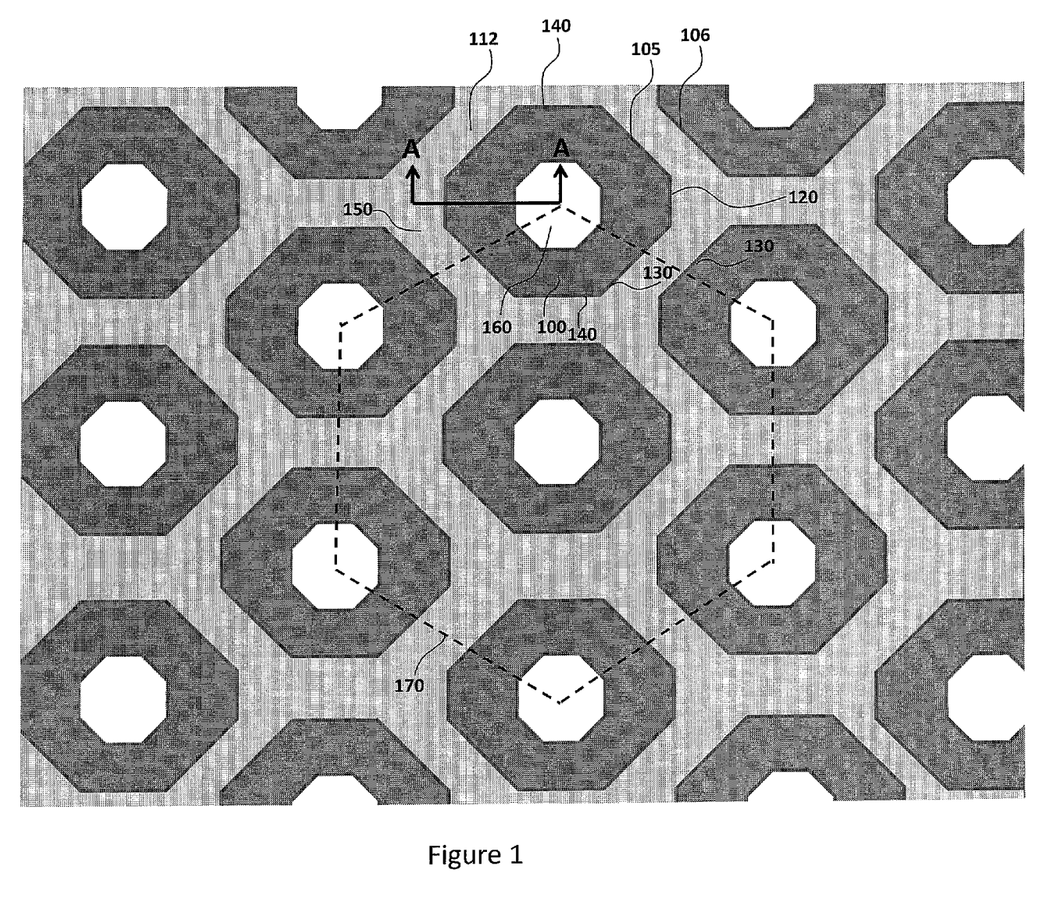
FIG. 1 illustrates a field-effect device layout which contains octagonal charge compensation trench zones and inverse-octagonal gate trench zones.

Referring to FIG. 1, a device layout for a set of super-junction field effect devices is shown. FIG. 1 is a top view of a portion of a silicon wafer layout illustrating the geometrical arrangement of the set of super-junction field-effect devices. Each field-effect device includes a gate zone 150 overlying a charge compensation zone. Gate zone 150 is bordered by gate trench sidewalls 105 and gate trench sidewalls 106. Gate zone 150 is an inverse-octagonal structure surrounding and above a charge compensation zone.

Underlying Si wafer zones 112 and 100 occupy all areas that are not deep trench zone 160. In use, groups of vertical field effect devices are generally metalized to operate in parallel as a single device.

The MOSFET field-effect devices are constructed on an epitaxial Si wafer with an n+ doped base substrate or on a non-epitaxial Si wafer with an n− doped substrate. IGBT field-effect devices are constructed on a non-epitaxial Si wafer with an n− doped substrate. The substrate of both devices is cut so that the top and bottom surfaces of the Si wafer are coplanar with equivalent {100} lattice planes. In a preferred embodiment, exterior trench sidewalls of the octagonal shaped areas defining gate zone 150 coincide with Si-crystallographic planes {001} lattice plane 140, {010} lattice plane 120 and {110} lattice plane 130.

The geometrical arrangement shown in FIG. 1 exhibits a hexagonal symmetry indicated by the hexagonal layout 170. In an alternate embodiment, a device layout can exhibit symmetries other than hexagonal symmetry or in addition to hexagonal symmetry.

The octagonal geometries are drawn having vertices at multiples of 45 degree angles (45°, 90° 135°, 180°, 225°, & 270°) and an internal angle of 135°, maintaining compatibility with native photomask processing. When creating masks, octagonal geometries can fracture into rectangles and trapezoids defining the vertical field-effect devices without photomask gridding errors. The octagonal geometries expose the {010}, {001} and {110} lattice planes and their equivalent silicon sidewall surfaces with known oxidation and epitaxial deposition characteristics. In addition, by varying the lengths of the octagonal sidewall surfaces relative to each other, devices with differing threshold voltages can be achieved without additional processing steps. Further, forming and mixing trenches with varying sidewall lengths allows for stress balancing during selective epitaxial refill. The device achieves a field-effect with improved packing density, improved current density, and improved on-resistance.

On-resistance is the resistance of a semiconductor device when it is biased in the "on-state" by applying certain voltages and/or currents to its terminals. ("On-state" meaning that current flow from the device input to output terminals is enabled.) For a MOSFET, for example, on-resistance is often defined as drain current (Id) divided by drain voltage (Vd) when Vd is set to 0.1V and the gate voltage (Vg) is set to 10V.

Figure 2A:
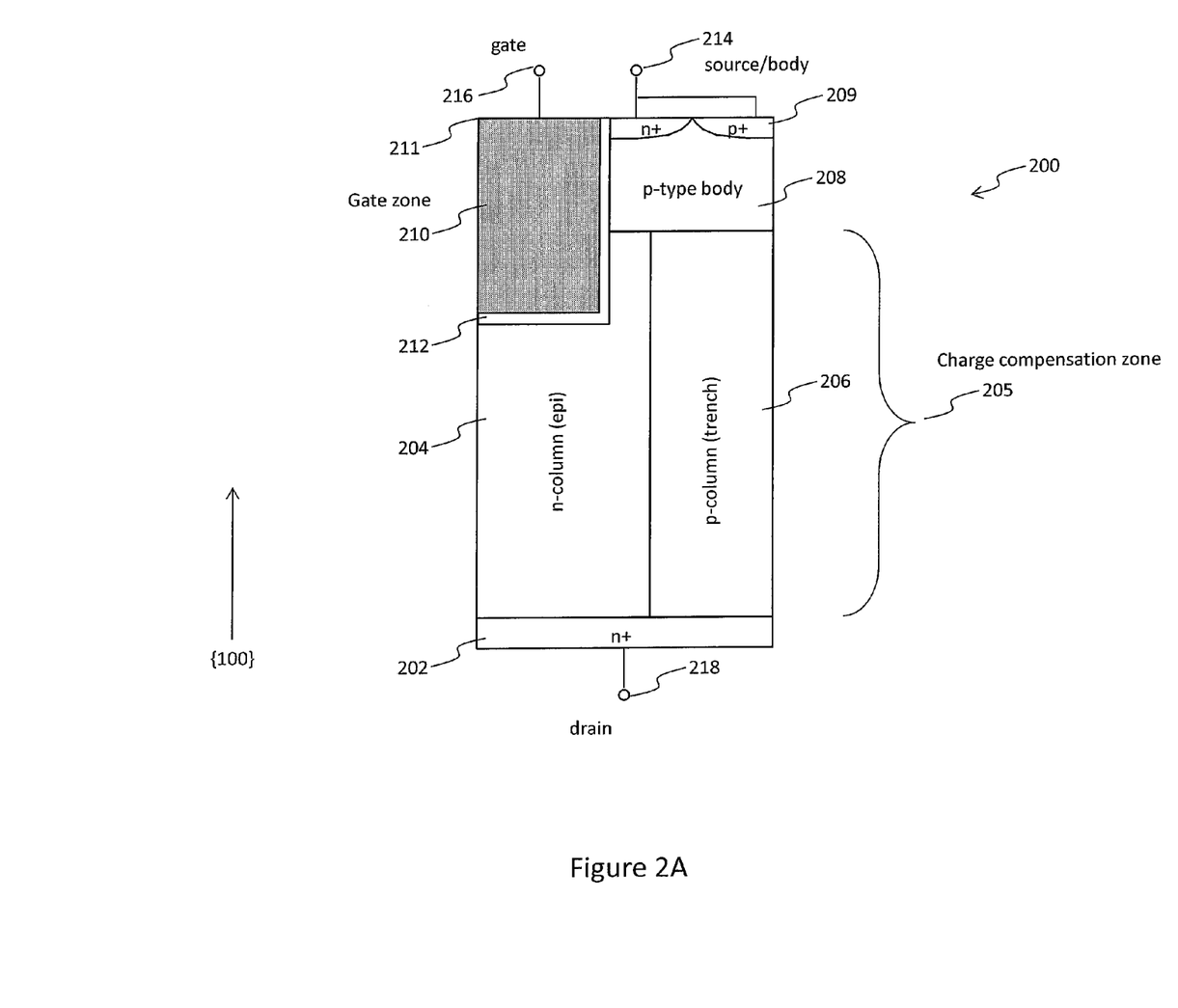
FIG. 2A illustrates a preferred embodiment of a field-effect device with an octagonal charge compensation region and an inverse octagonal gate trench, where the charge compensation region includes an n-type epitaxial column and a p-type trench column.

FIG. 2A shows a preferred embodiment of cross-section "AA" of FIG. 1. Vertical MOSFET field-effect device 200 comprises an n+ substrate 202 which is metalized on the bottom surface to form drain electrode 218. N+ substrate 202 is in contact with n-column 204 and p-column 206 which are adjacent one another and which together form charge compensation zone 205. N-column 204 and p-column 206 are in further contact with p-type body region 208.

An n+ source electrode 214 is adjacent p-type body region 208. P-type body region 208 includes p+ body-contacting electrode 209 which is electrically shorted to n+ source electrode 214 to avoid accidental excitation of a parasitic bipolar junction transistor which is formed between the n+ source electrode, p-type body region and the drain electrode.

Gate zone 210 is formed from an inverse-octagonal trench above n-column 204 and separated from n-column 204, p-column 206 and p-type body region 208 by a thin walled insulation oxide layer 212. Gate zone 210 is filled with gate electrode material adjacent oxide layer 212 and has a metallization layer 211 contacting the gate electrode material. Metallization layer 211 is in electrical contact with gate electrode 216.

In a preferred embodiment, oxide layer 212 is a silicon dioxide layer and gate electrode material is a polysilicon (polycrystalline Si) material.

Figure 2B:
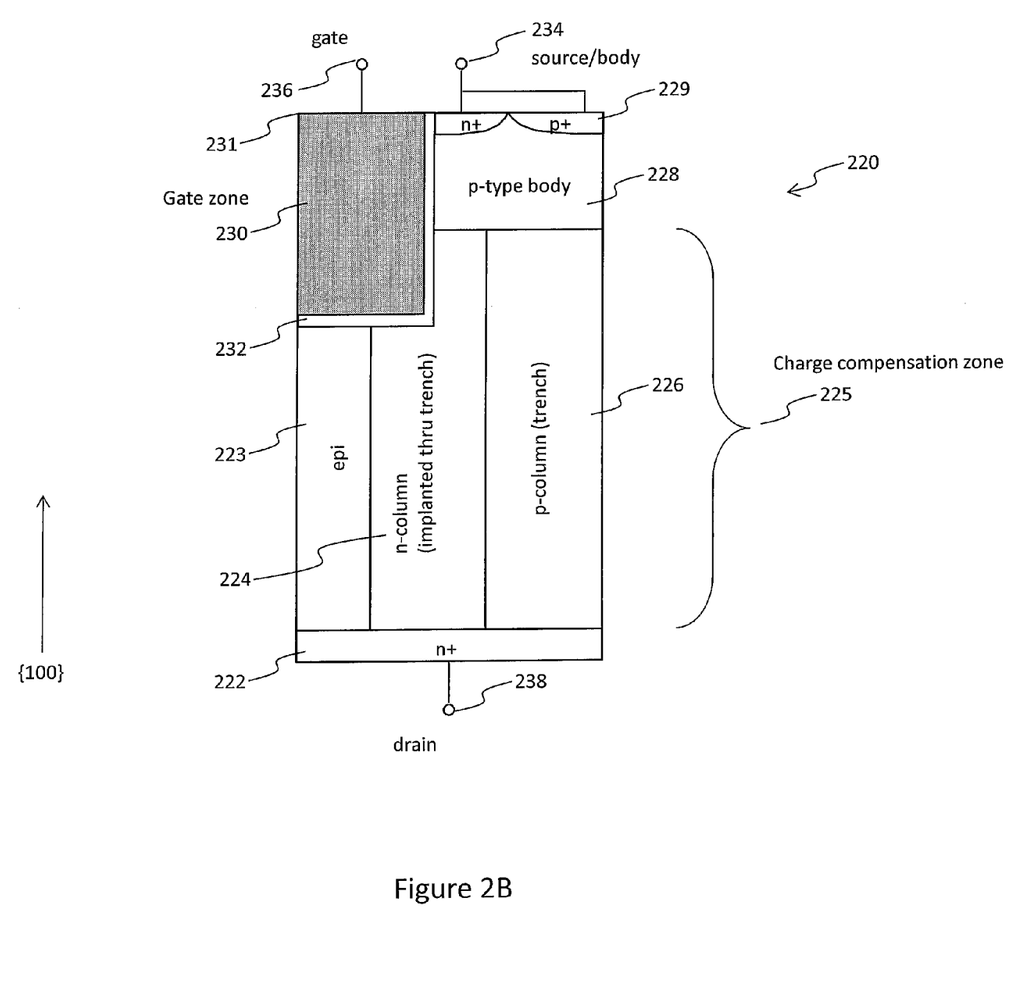
FIG. 2B illustrates a preferred embodiment of a field-effect device with an octagonal charge compensation region and an inverse octagonal gate trench, where the charge compensation region includes an epitaxial n-type material, an ion-implanted n-column and a p-type trench column.

Referring to FIG. 2B, a second embodiment of a vertical field effect device is disclosed. Vertical MOSFET field-effect device 220 comprises an n+ substrate 222 which is metalized on the bottom surface to form drain electrode 238. N+ substrate 222 is in contact with an n-type epitaxial layer 223, n-column layer 224 and p-column layer 226. N-type epitaxial layer 223 has a first doping (substantially intrinsic, and with a doping level of less than $5 \times 10^{13}$), n-column layer 224 is adjacent substantially intrinsic epitaxial layer 223 and has a second doping (with a doping level between $1 \times 10^{14}$ and $1 \times 10^{17}$) different than the first doping. P-column layer 226 is adjacent n-column layer 224 and has a third doping (p type, with a doping level between $1e^{14}$ and $1e^{17}$). N-type epitaxial layer 223, n-column layer 224 and p-column layer 226 together form charge compensation zone 225. N-column layer 224 and p-column 226 are in further contact with p-type body region 228.

An n+ source electrode 234 is adjacent p-type body region 228. P-type body region 228 includes p+ body-contacting electrode 229 which is electrically shorted to n+ source electrode 234 to avoid accidental excitation of a parasitic bipolar junction transistor which is formed between the n+ source electrode, p-type body region and the drain electrode.

Gate zone 230 is formed as an inverse-octagonal trench above first n-column epitaxial layer 223 and second n-column layer 224, with a thin walled insulation oxide layer 232 separating the gate electrode material from n-type epitaxial layer and the n-column. Gate zone 230 is filled with gate electrode material adjacent oxide layer 232 and has a metallization layer 231 contacting the gate electrode material. Metallization layer 231 is in electrical contact with gate electrode 236.

In a preferred embodiment, oxide layer 232 is a silicon dioxide layer and gate electrode material is a polysilicon (polycrystalline Si) material.

Figure 2C:
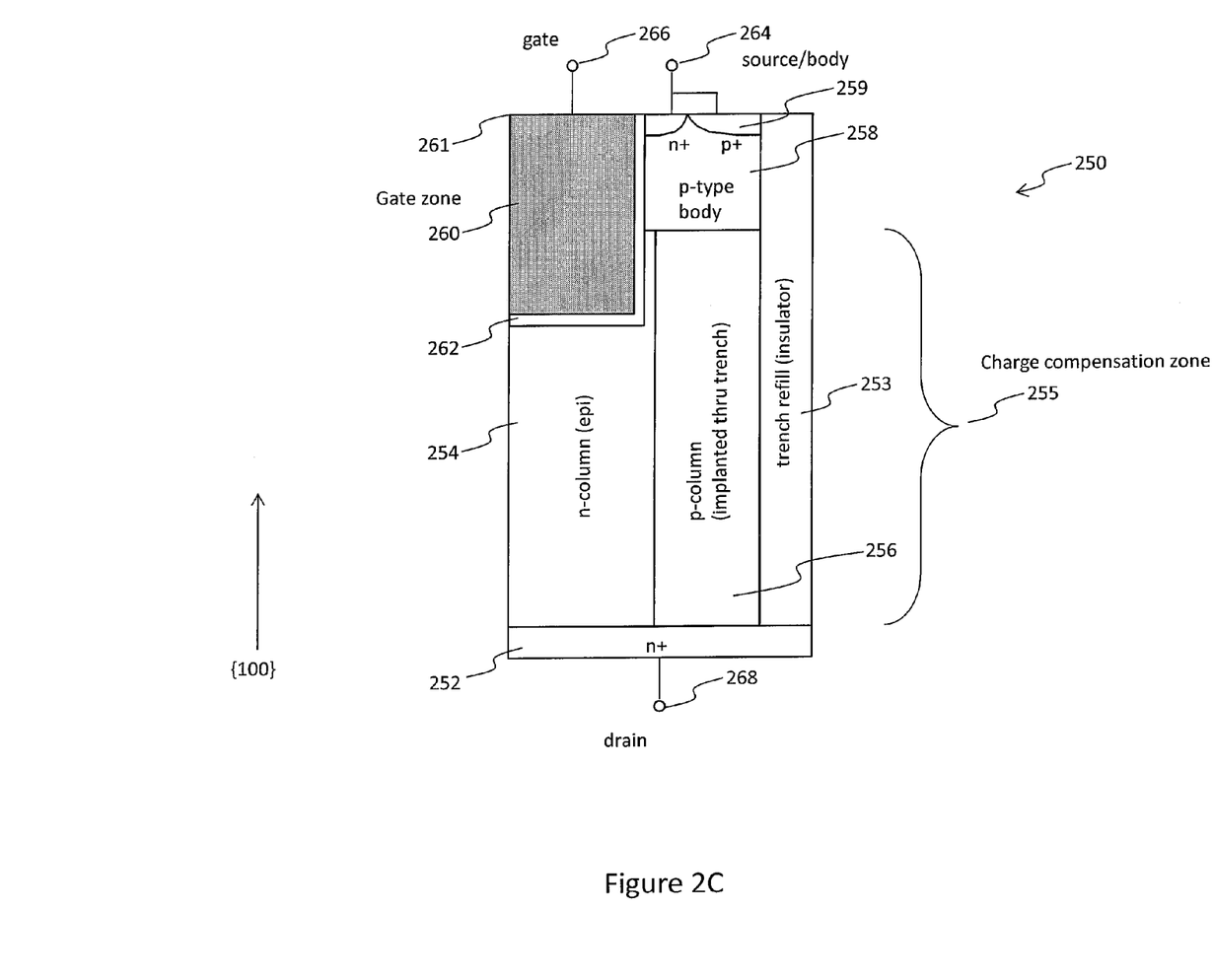
FIG. 2C illustrates a preferred embodiment of a field-effect device with an octagonal charge compensation region and an inverse octagonal gate trench, where the charge compensation region includes an n-type epitaxial column, an ion-implanted p-type column and an insulating trench refill.

Referring to FIG. 2C, a third embodiment of a vertical field effect device is disclosed. Vertical MOSFET field-effect device 250 comprises an n+ substrate 252 which is metalized on the bottom surface to form drain electrode 268 and is coplanar with the {100} lattice plane. N+ substrate 252 is in contact with n-column 254 and p-column 256 which are adjacent one another and which together form charge compensation zone 255. N-column 254 and p-column 256 are in further contact with insulation trench layer 253 and with p-type body region 258. An n+ source electrode 264 is adjacent p-type body region 258. P-type body region 258 includes p+ body-contacting electrode 259 which is electrically shorted to n+ source electrode 264 to avoid accidental excitation of a parasitic bipolar junction transistor which is formed between the n+ source electrode, p-type body region and the drain electrode.

Gate zone 260 is formed as an inverse-octagonal trench above n-column 254 separated from n-column 254 and p-type body region 258 by a thin walled insulation oxide layer 262. Gate zone 260 is filled with gate electrode material adjacent oxide layer 262 and has a metallization layer 261 contacting the gate electrode material. Metallization layer 261 is in electrical contact with gate electrode 266.

In a preferred embodiment, oxide layer 262 is a silicon dioxide layer and gate electrode material is a polysilicon (polycrystalline Si) material.

Figure 3A:
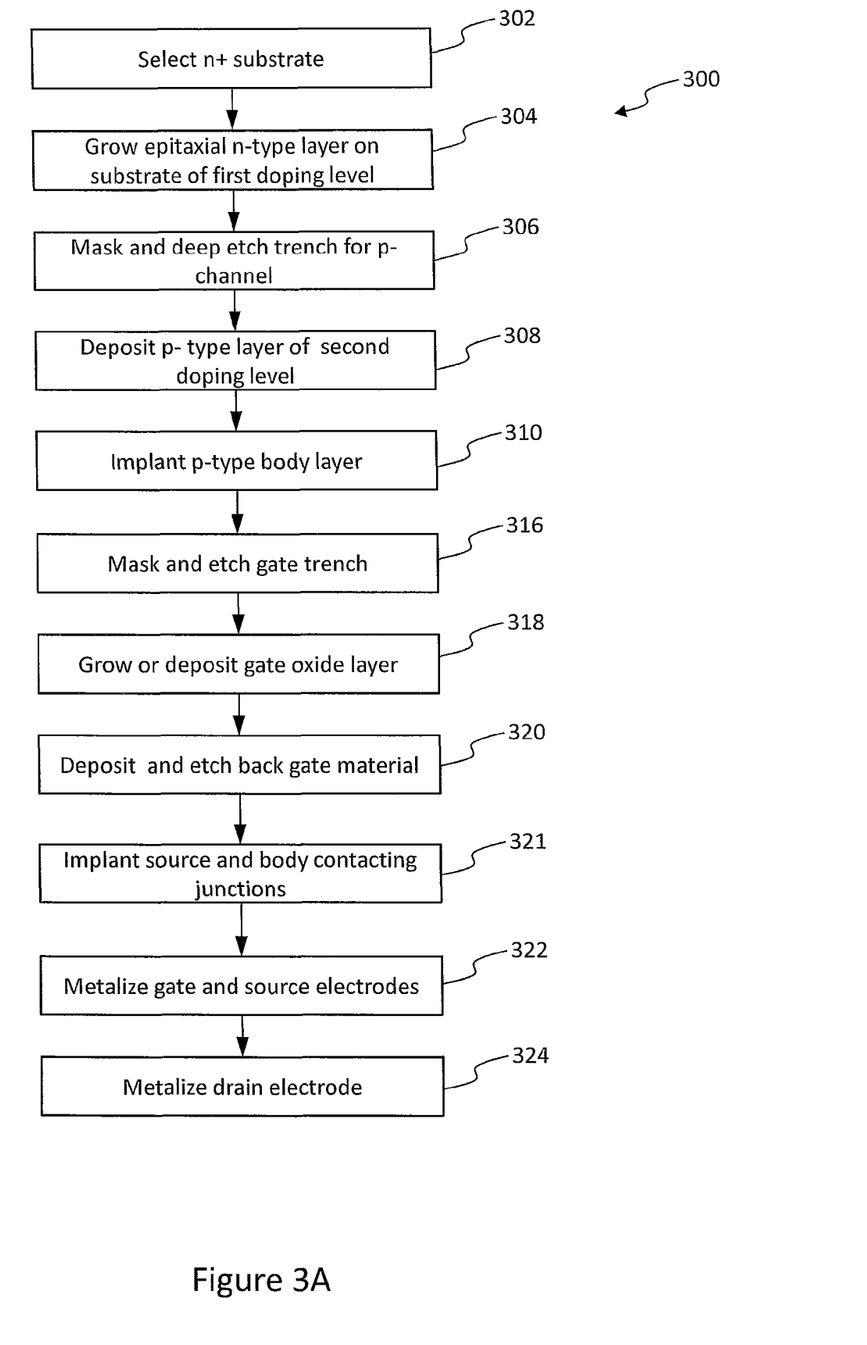
FIG. 3A is a flow chart of a preferred embodiment of a method for construction of a super-junction vertical field-effect device with octagonal geometry.

Referring to FIG. 3A a method 300 for construction of a set of super-junction MOSFET field-effect devices as in FIG. 2A is described. At step 302, the method begins by growing an n+ doped substrate oriented to be coplanar with the {100} lattice plane. At step 304, an n-type epitaxial layer of an n− material of a first doping level is epitaxially grown above the n+ doped substrate. At step 306, a suitable mask is applied and a deep octagonal trench is etched into the n-type epitaxial layer with the edges of the octagonal trench aligning with the {010}, {110} and {001} planes of the n+ doped substrate.

In a preferred embodiment, the bottom of the trench exposes the n+ substrate. In another embodiment, the bottom of the trench stops short of exposing the n+ substrate.

At step 308, a p-type epitaxial layer of a second doping level is deposited into the trench. At step 310, a p-type body layer of a third doping level is implanted into and above the n-type and p-type epitaxial layers. At step 316, a suitable mask is applied and an inverse octagonal gate trench is etched through the p-type body layer and into the n-type epitaxial layer. At step 318, a thin gate oxide layer is grown or deposited into the gate trench in contact with the n-type epitaxial layer, p-type body layer and n+ source region. At step 320, a gate material, such as polysilicon, is deposited into the gate trench in contact with the thin gate oxide layer and etched back to be substantially coplanar with the top surface. At step 321, a mask is applied and an n+ source junction is implanted, then another mask is applied and a p+ body-contacting junction is implanted. At step 322, a suitable mask is applied and metallization is deposited over the gate material and the n+ source junction to from the gate and source electrodes, respectively. At step 324, the bottom side of the n+ substrate is metalized to form the drain electrode.

Figure 3B:
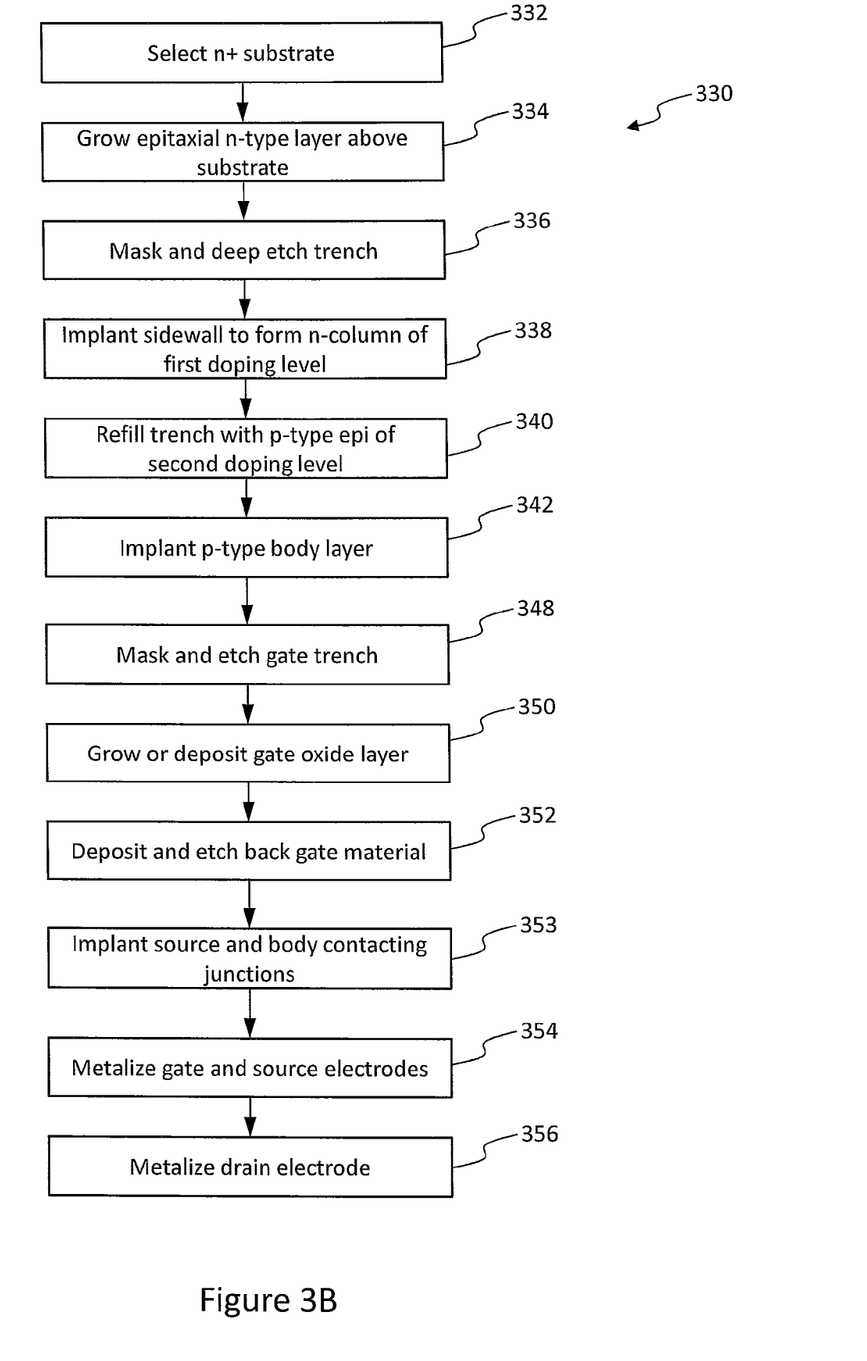
FIG. 3B is a flow chart of an alternate embodiment of a method for construction of a super-junction vertical field-effect device with octagonal geometry.

Referring to FIG. 3B a method 330 for construction of a set of super-junction MOSFET field-effect devices as in FIG. 2B is described. At step 332, the method begins by growing an n+ doped substrate oriented to be coplanar with the {100} lattice plane. At step 334, a substantially intrinsic n-type epitaxial layer is epitaxially grown on the n+ substrate. At step 336, a suitable mask is applied and an octagonal trench is etched from the n-type epitaxial layer where the sidewalls of the octagonal trench align with the {001}, {010} and {110} lattice planes of the n+ substrate.

In a preferred embodiment, the bottom of the trench exposes the n+ substrate. In another embodiment, the bottom of the trench stops short of exposing the n+ substrate.

At step 338, the sidewalls of the octagonal trench are implanted using ion implantation to form an n-column layer of a first doping level. At step 340, a p-column layer of a second doping level is deposited into the octagonal trench to contact the n-column layer and to refill the trench. In a preferred embodiment, the p-column layer is a p-type epitaxial material. At step 342, a p-type body layer of third doping level is implanted into and above the substantially intrinsic n-type epitaxial layer, n-column layer and p-column layer. At step 348, another mask is applied and a gate trench is etched through the p-type body layer and into the n-column and p-column layers. At step 350, a thin gate oxide layer is grown or deposited into the gate trench in contact with the n-column layer, p-type body layer and n+ source region. At step 352, a gate material, such as polysilicon, is deposited into the gate trench in contact with the thin gate oxide layer and etched back to be substantially co-planar with the top surface. At step 353, a mask is applied and an n+ source junction is implanted, then another mask is applied and a p+ body-contacting junction is implanted. At step 354, a suitable mask is applied and metallization is deposited over the gate material and the n+ source junction to from the gate and source electrodes, respectively. At step 356, the bottom side of the n+ substrate is metalized to form the drain electrode.

Figure 3C:
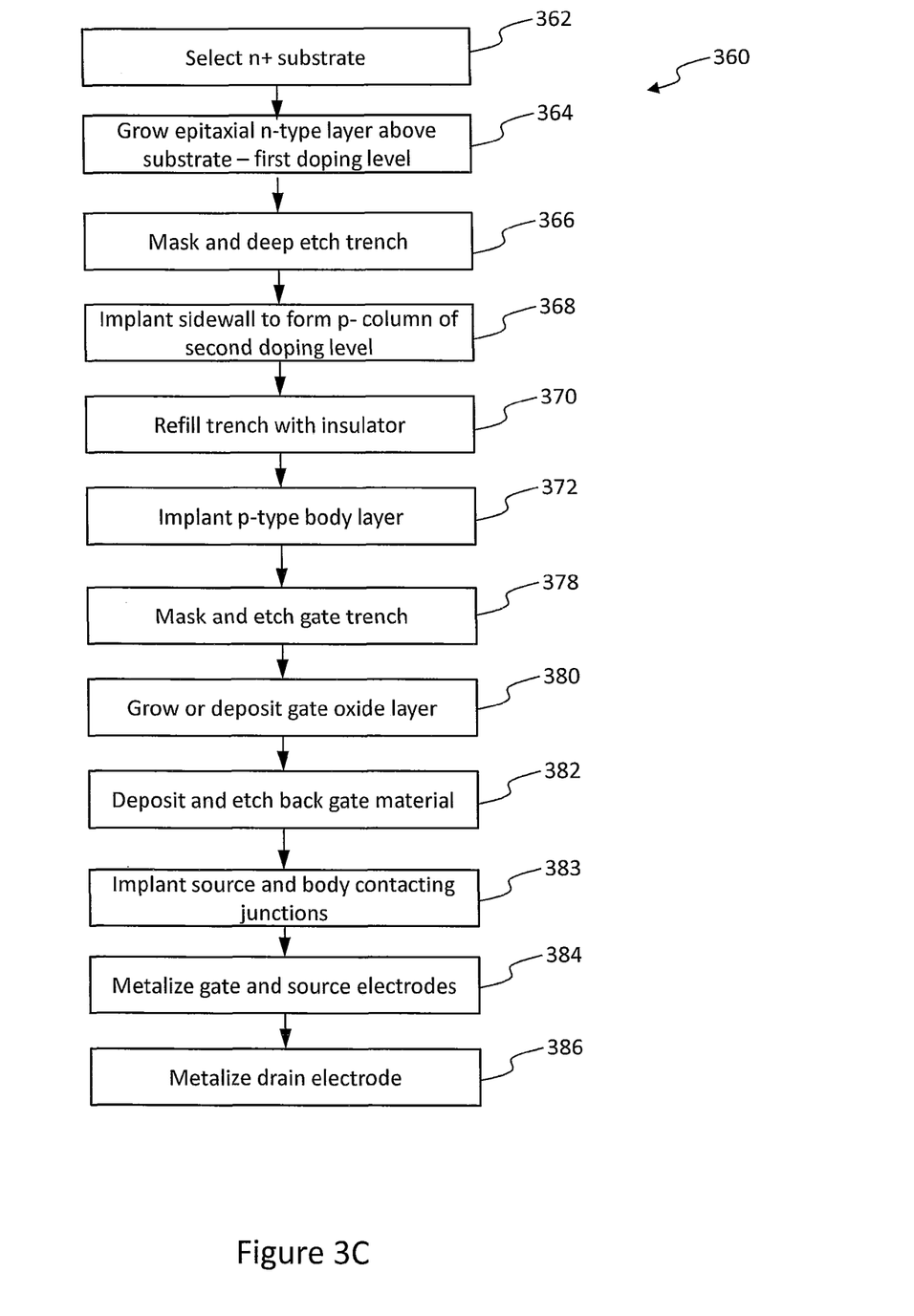
FIG. 3C is a flow chart of an alternate embodiment of a method for construction of a super-junction vertical field-effect device with octagonal geometry.

Referring to FIG. 3C a method 360 for construction of a set of super-junction MOSFET field-effect devices as in FIG. 2C is described. At step 362, the method begins by growing an n+ doped substrate oriented to be coplanar with a {100} lattice plane. At step 364, an n-type epitaxial layer of an n− material of a first doping level is epitaxially grown above the n+ doped substrate. At step 366, a suitable mask is applied and a deep octagonal trench is etched into the n-type epitaxial layer with the edges of the octagonal trench aligning with the {010}, {110} and {001} lattice planes of the n+ substrate.

In a preferred embodiment, the bottom of the trench exposes the n+ substrate. In an another embodiment, the bottom of the trench stops short of exposing the n+ substrate.

At step 368, a p-column layer of a second doping level is implanted into the sidewalls adjacent the n-type epitaxial layer of the octagonal trench. At step 370, the octagonal trench is refilled with an insulating material, such as $SiO_2$, to form an insulator layer which is in contact with the p-column layer. At step 372, a p-type body layer of third doping level is implanted into and above the n-type epitaxial layer and p-column layer, adjacent the insulator layer. At step 378, a mask is applied and a gate trench is etched through the p-type body layer and into the n-type epitaxial layer. At step 380, a thin gate oxide layer is grown or deposited into the gate trench in contact with the n-type epitaxial layer and p-type body layer. At step 382, a gate material, such as polysilicon, is deposited into the gate trench in contact with the thin gate oxide layer and etched back to substantially co-planar with the top surface. At step 383, a mask is applied and an n+ source junction is implanted, then another mask is applied and a p+ body-contacting junction is implanted. At step 384, a suitable mask is applied and metallization is deposited over the gate material and the n+ source junction to from the gate and source electrodes, respectively. At step 386, the bottom side of the n+ substrate is metalized to form the drain electrode.

The embodiments presented in this disclosure are intended to provide implementable examples of the present invention, but are not intended to limit the present invention. For example, other materials besides Si can be used as a base semiconductor material. Various ranges of doping levels for the n+ regions, n-columns, p-columns and p-type body can be employed as required.

The invention claimed is:

1. A method for making a field effect device comprising the steps of:
   providing a semiconductor substrate with a first surface on a first {100} lattice plane and a second surface on a second {100} lattice plane;
   providing a device layout comprising a first set of sidewalls coplanar with a set of {001} lattice planes, a second set of sidewalls coplanar with a set of {010} lattice planes, and a third set of sidewalls coplanar with a set of {110} lattice planes; and,
   constructing a super-junction field effect device with the device layout.

2. The method of claim 1 further comprising the steps of:
   constructing a charge compensation zone, with an octagonal geometry, on the first surface;
   constructing a body region, adjacent the charge compensation zone;
   etching a gate trench, having the octagonal geometry, into the charge compensation zone;
   forming a gate oxidation layer in the gate trench;
   filling the gate trench with a gate electrode material;
   constructing a source junction region in the body region, applying a gate metallization layer to the gate electrode material;
   applying a source metallization layer to the source junction region; and
   applying a drain metallization layer to the second surface.

3. The method of claim 1 further comprising the steps of:
   defining a prescribed composite threshold voltage;
   adjusting a length, of a chosen sidewall of the group of the first set of sidewalls, the second set of sidewalls and the third set of sidewalls, to achieve the super-junction field effect device with the prescribed composite threshold voltage.

4. The method of claim 1 further comprising the steps of:
   defining a prescribed material stress in a charge compensation zone; and
   adjusting a length, of a chosen sidewall of the group of the first set of sidewalls, the second set of sidewalls and the third set of sidewalls, to achieve the super-junction field effect device with the prescribed material stress.

5. The method of claim 1 further comprising the steps of:
   selecting an n+substrate for the semiconductor substrate;
   growing an n-type epitaxial layer, of a first doping level, on the n+substrate;
   masking the n-type epitaxial layer with a photomask of an octagonal geometry;
   etching a trench, in the n-type epitaxial layer, with the octagonal geometry;
   depositing a p-type layer, of a second doping level, into the trench forming a p-column layer; and
   forming a p-type body layer on the n-type epitaxial layer and the p-column layer.

6. The method of claim 1 further comprising the steps of:
   selecting an n+substrate for the semiconductor substrate;
   growing an n-type epitaxial layer on the n+substrate;
   masking the n-type epitaxial layer with a photomask of an octagonal geometry;
   etching a trench, in the n-type epitaxial layer, having a set of trench sidewalls with the octagonal geometry;
   implanting the set of trench sidewalls with an n-column layer of a first doping level;
   refilling the trench with a p-type layer of a second doping level forming a p-column layer; and
   forming a p-type body layer on the n-column layer and the p-column layer.

7. The method of claim 1 further comprising the steps of:
   selecting an n+substrate for the semiconductor substrate;
   growing an n-type epitaxial layer, of a first doping level, on the n+substrate;
   masking the n-type epitaxial layer with a photomask of an octagonal geometry;
   etching a trench, in the n-type epitaxial layer, having a set of trench sidewalls with the octagonal geometry;
   implanting the set of trench sidewalls with a p-type dopant forming a p-column layer of a second doping level;
   refilling the trench with an insulating material; and
   forming a p-type body layer on the n-type epitaxial layer and the p-column layer.

8. An apparatus comprising:
   a semiconductor substrate with
     a first surface on a first {100} lattice plane and
     a second surface on a second {100} lattice plane;
   a device layout comprising
     a first set of sidewalls coplanar with a set of {001} lattice planes,
     a second set of sidewalls coplanar with a set of {010} lattice planes, and
     a third set of sidewalls coplanar with a set of {110} lattice planes; and
   a super-junction field effect device constructed with the device layout.

9. The apparatus of claim 8 further comprising:
   a charge compensation zone, constructed with an octagonal geometry, on the first surface;
   a body region constructed adjacent the charge compensation zone;
   a gate trench, having the octagonal geometry, etched into the charge compensation zone;
   a gate oxidation layer formed in the gate trench;
   the gate trench filled with a gate electrode material;
   a source junction region constructed in the body region;
   a gate metallization layer applied to the gate electrode material;
   a source metallization layer applied to the source junction region; and
   a drain metallization layer applied to the second surface.

10. The apparatus of claim 8 further comprising:
    a length, of a chosen sidewall of the group of the first set of sidewalls, the second set of sidewalls and the third set of sidewalls, adjusted to achieve the super-junction field effect device with prescribed composite threshold voltage.

11. The apparatus of claim 8 further comprising:
    a length, of a chosen sidewall of the group of the first set of sidewalls, the second set of sidewalls and the third set of sidewalls, adjusted to achieve the super-junction field effect device with a prescribed material stress in a charge compensation zone.

12. The apparatus of claim 8 further comprising:
    an n+substrate for the semiconductor substrate;
    an n-type epitaxial layer, of a first doping level, grown on the n+substrate;
    the n-type epitaxial layer masked with a photomask of an octagonal geometry;
    a trench, in the n-type epitaxial layer, etched with the octagonal geometry;
    a p-type layer, of a second doping level, deposited into the trench forming a p-column layer; and
    a p-type body layer formed on the n-type epitaxial layer and the p-column layer.

13. The apparatus of claim 8 further comprising:
an n+substrate for the semiconductor substrate;
an n-type epitaxial layer grown on the n+substrate;
the n-type epitaxial layer masked with a photomask of an octagonal geometry;
a trench, in the n-type epitaxial layer, etched to have a set of trench sidewalls with the octagonal geometry;
the set of trench sidewalls implanted with an n-column layer of a first doping level;
the trench refilled with a p-type layer of a second doping level forming a p-column layer; and
a p-type body layer formed on the n-column layer and the p-column layer.

14. The apparatus of claim 8 further comprising:
an n+substrate for the semiconductor substrate;
an n-type epitaxial layer, of a first doping level, grown on the n+substrate;
the n-type epitaxial layer masked with a photomask of an octagonal geometry;
a trench, in the n-type epitaxial layer, etched to have a set of trench sidewalls with the octagonal geometry;
the set of trench sidewalls implanted with a p-type dopant forming a p-column layer of a second doping level;
the trench refilled with an insulating material; and
a p-type body layer formed on the n-type epitaxial layer and the p-column layer.

15. A system comprising a plurality of field effect devices, each field effect device comprising:
a semiconductor substrate with
a first surface on a first {100} lattice plane and
a second surface on a second {100} lattice plane;
a device layout comprising
a first set of sidewalls coplanar with a set of {001} lattice planes,
a second set of sidewalls coplanar with a set of {010} lattice planes, and
a third set of sidewalls coplanar with a set of {110} lattice planes; and
a super-junction field effect device is constructed with the device layout.

16. The system of claim 15 with each field effect device further comprising:
a charge compensation zone, constructed with an octagonal geometry, on the first surface;
a body region constructed adjacent the charge compensation zone;
a gate trench, having the octagonal geometry, etched into the charge compensation zone;
a gate oxidation layer formed in the gate trench;
the gate trench filled with a gate electrode material;
a source junction region constructed in the body region;
a gate metallization layer applied to the gate electrode material;
a source metallization layer applied to the source junction region; and
a drain metallization layer applied to the second surface.

17. The system of claim 15 with each field effect device further comprising:
a length, of a chosen sidewall of the group of the first set of sidewalls, the second set of sidewalls and the third set of sidewalls, adjusted to achieve the super-junction field effect device with prescribed composite threshold voltage.

18. The system of claim 15 with each field effect device further comprising:
a length, of a chosen sidewall of the group of the first set of sidewalls, the second set of sidewalls and the third set of sidewalls, adjusted to achieve the super-junction field effect device with a prescribed material stress in a charge compensation zone.

19. The system of claim 15 with each field effect device further comprising:
an n+substrate for the semiconductor substrate;
an n-type epitaxial layer, of a first doping level, grown on the n+substrate;
the n-type epitaxial layer masked with a photomask of an octagonal geometry;
a trench, in the n-type epitaxial layer, etched with the octagonal geometry;
a p-type layer, of a second doping level, deposited into the trench forming p-column layer; and
a p-type body layer formed on the n-type epitaxial layer and the p-column layer.

20. The system of claim 15 with each field effect device further comprising:
an n+substrate for the semiconductor substrate;
an n-type epitaxial layer grown on the n+substrate;
the n-type epitaxial layer masked with a photomask of an octagonal geometry;
a trench, in the n-type epitaxial layer, etched to have a set of trench sidewalls with the octagonal geometry;
the set of trench sidewalls implanted with an n-column layer of a first doping level;
the trench refilled with a p-type layer of a second doping level forming a p-column layer; and
a p-type body layer formed on the n-column layer and the p-column layer.

21. The system of claim 15 with each field effect device further comprising:
an n+substrate for the semiconductor substrate;
an n-type epitaxial layer, of a first doping level, grown on the n+substrate;
the n-type epitaxial layer masked with a photomask of an octagonal geometry;
a trench, in the n-type epitaxial layer, etched to have a set of trench sidewalls with the octagonal geometry;
the set of trench sidewalls implanted with a p-type dopant forming a p-column layer of a second doping level;
the trench refilled with an insulating material; and
a p-type body layer formed on the n-type epitaxial layer and the p-column layer.

* * * * *

UNITED STATES PATENT AND TRADEMARK OFFICE
CERTIFICATE OF CORRECTION

| | | |
|---|---|---|
| PATENT NO. | : 9,496,386 B2 | Page 1 of 1 |
| APPLICATION NO. | : 14/817010 | |
| DATED | : November 15, 2016 | |
| INVENTOR(S) | : Thomas E. Harrington, III et al. | |

It is certified that error appears in the above-identified patent and that said Letters Patent is hereby corrected as shown below:

In the Specification

In Column 9, Line 39 delete "is"

Signed and Sealed this
Sixth Day of June, 2017

Michelle K. Lee
*Director of the United States Patent and Trademark Office*